United States Patent [19]

Choi et al.

[11] Patent Number: 4,965,214

[45] Date of Patent: Oct. 23, 1990

[54] METHOD FOR MANUFACTURING POLY-CRYSTAL SILLICON HAVING HIGH RESISTANCE

[75] Inventors: Kyu H. Choi; Jung H. Lee, both of Seoul; Heyung-Sub Lee, Daejun; Tae-Yoon Yook; Dong-Joo Bae, both of Suwon, all of Rep. of Korea

[73] Assignee: SamSung Electronics Co., Ltd., Suwon, Rep. of Korea

[21] Appl. No.: 224,810

[22] Filed: Jul. 27, 1988

[30] Foreign Application Priority Data

Jul. 31, 1987 [KR] Rep. of Korea .................. 1987-8419

[51] Int. Cl.$^5$ .................. H01L 21/265; H01L 21/70
[52] U.S. Cl. ........................................ 437/24; 437/27; 437/28; 437/60; 437/918; 148/DIG. 136
[58] Field of Search ................ 437/24, 26, 28, 27, 437/60, 233, 918; 148/DIG. 136; 357/54, 59

[56] References Cited

U.S. PATENT DOCUMENTS

| | | | |
|---|---|---|---|
| 4,014,037 | 3/1977 | Matsushita et al. | 357/54 |
| 4,016,007 | 4/1977 | Wada et al. | 437/24 |
| 4,084,986 | 4/1978 | Aoki et al. | 437/24 |
| 4,406,051 | 9/1983 | Iizuka | 437/60 |
| 4,584,026 | 4/1986 | Wu et al. | 437/27 |
| 4,602,421 | 7/1986 | Lee et al. | 148/DIG. 136 |
| 4,663,827 | 5/1987 | Nakahara | 437/24 |
| 4,707,909 | 11/1987 | Blanchard | 148/DIG. 136 |
| 4,740,481 | 4/1988 | Wilson et al. | 437/24 |
| 4,755,480 | 7/1988 | Yau et al. | 148/DIG. 136 |
| 4,762,801 | 8/1988 | Kapoor | 148/DIG. 136 |

FOREIGN PATENT DOCUMENTS

| | | | |
|---|---|---|---|
| 0231703 | 8/1987 | European Pat. Off. | 437/24 |
| 0097791 | 8/1978 | Japan | 437/24 |
| 0161857 | 9/1984 | Japan | 148/DIG. 136 |

OTHER PUBLICATIONS

Ghandhi, VLSI Fabrication Principles, John Wiley & Sons, 1983, pp. 353-354.

*Primary Examiner*—Olik Chaudhuri
*Assistant Examiner*—M. Wilczewski
*Attorney, Agent, or Firm*—Robert E. Bushnell

[57] ABSTRACT

Method for manufacturing polycrystalline silicon having high resistance, having a first step for depositing a polycrystalline silicon layer for a resistor area over a silicon semiconductor substrate; a second step for growing a first thermal oxide layer having a first specified depth over the polycrystalline silicon layer, ion-implanting with the nitrogen thereon, and growing a second thermal oxide layer having a second specified depth on the ion-implanted layer; a third step for forming a resistor pattern of the polycrystalline silicon with a photo etching method; and a fourth step for ion-implanting impurities in order to decrease the resistance of the polycrystalline silicon as contact regions to be used in resistance contacts with a fixed semiconductor region on the substrate.

21 Claims, 4 Drawing Sheets

METHOD FOR MANUFACTURING POLY-CRYSTAL SILLICON HAVING HIGH RESISTANCE

BACKGROUND OF THE INVENTION

This invention relates to a method for manufacturing polycrystalline silicon having high resistance.

The polycrystalline silicon having high resistance is widely used as a material for semiconductor devices and in particular for static random access memories (SRAM). FIG. 1 illustrates a cell structure of SRAM that is currently in wide use, in which two high resistors (R1 and R2) and MOS transistors (T1 and T2) in series are coupled between a source supply voltage Vcc and a ground potential Vss. Nodes (1) and (2) between the high resistors and the MOS transistors are respectively coupled to gates of the MOS transistors (T2) and (T1) in a cross connection. Between these node points (1), (2) and bit lines (BL) ($\overline{BL}$) are respectively connected, MOS transistors T3 and T4, gates of which are coupled to word line (WL). In an alternative embodiment, ions of inert gases, rather than nitrogen ions, are implanted into polycrystalline silicon layer 15.

For the SRAM, the polycrystalline silicon normally having a resistance of 200-300 GΩ is used. With the polycrystalline silicon, information charged at the node points (1), (2) makes it possible to supplement leakage current leaked out to the transistors (T1, T2, T3 and T4). The higher the integration of memory devices becomes, the more the polycrystalline silicon having higher resistance than 200-300 GΩ is needed.

Many researches have been made these days to methods for manufacturing polycrystalline silicon having high resistance. In the prior art, the high resistance in the polycrystalline silicon has been achieved through reducing thickness of the polycrystalline silicon or implanting such impurities as arsenic (As), phosphorus (P) and boron (B) with a $10^{11}$–$10^{14}$/cm$^2$ dose. Although the resistance of polycrystalline silicon could be increased when the above mentioned methods are employed, there arise complexities in process conditions or specific limitations in increasing the resistance to be required in higher density SRAM.

OBJECT OF THE INVENTION

Accordingly, the object of this invention is to provide a method for manufacturing the polycrystalline silicon of high resistance with a simple manufacturing process, thereby achieving a higher integration of semiconductor devices.

To achieve this and other objects of the invention, the method for manufacturing the polycrystalline silicon of high resistance is characterized in comprising: a first step for depositing a polycrystalline silicon layer for a resistor area over a silicon semiconductor substrate; a second step for growing a first thermal oxide layer having a first specified depth over the polycrystalline silicon layer, ion-implanting with the nitrogen thereon, and growing a second thermal oxide layer having a second specified depth on the ion-implanted layer; a third step for forming a resistor pattern of the polycrystalline silicon with a photo etching method; and a fourth step for ion-implanting impurities in order to decrease the resistance of the polycrystalline silicon in contact regions to be used in resistance contacts with a fixed semiconductor region on the substrate.

The invention will be better understood by reference to the following detailed description taken in connection with the accompanying drawings.

DETAILED DESCRIPTION OF THE INVENTION

Figure 1:
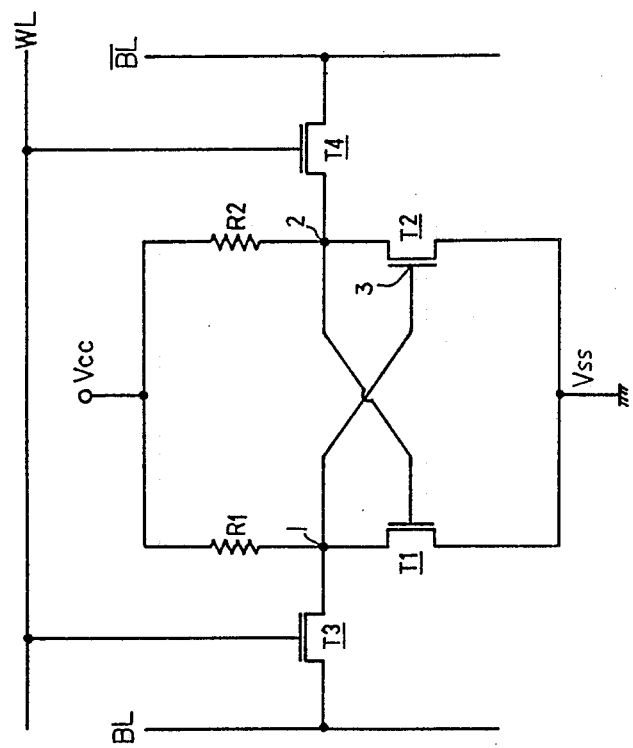
FIG. 1 shows a cell structure of a SRAM.
Figure 2A:
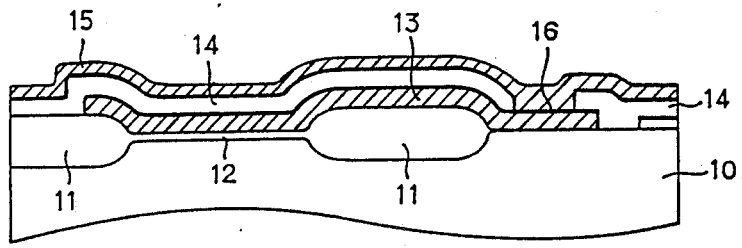
FIGS. 2A to 2E are cross-sectional views sequentially illustrating the fabrication stages of one embodiment according to the invention.
Figure 2B:
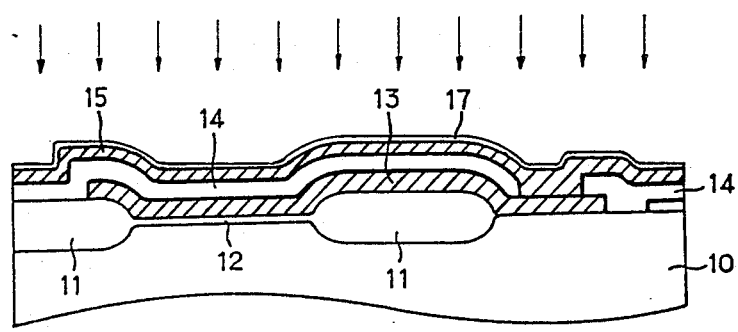

Detailed description of this invention will be made hereunder referring to drawings. FIGS. 2A to 2E represent the cross-sectional views sequentially illustrating the fabrication steps of one preferred embodiment according to the invention. Referring to FIG. 2A, polycrystalline silicon (15) for a resistor is deposited with the chemical vapor deposition (CVD) method to a depth of 500-10,000 Å over silicon substrate (10) on which has been formed field oxide (11), gate oxide (12) and polycrystalline silicon gate (13) therein. A first oxide layer (14) separates the polycrystalline silicon gate (13) from the polycrystalline silicon (15). The polycrystalline silicon gate (13) and the polycrystalline silicon (15) for a resistor are connected to each other through region (16). Referring to FIG. 1, the region (16) may correspond to the node point (1) between the gate (3) of the transistor (T2) and the resistor (R1).

Figure 3:
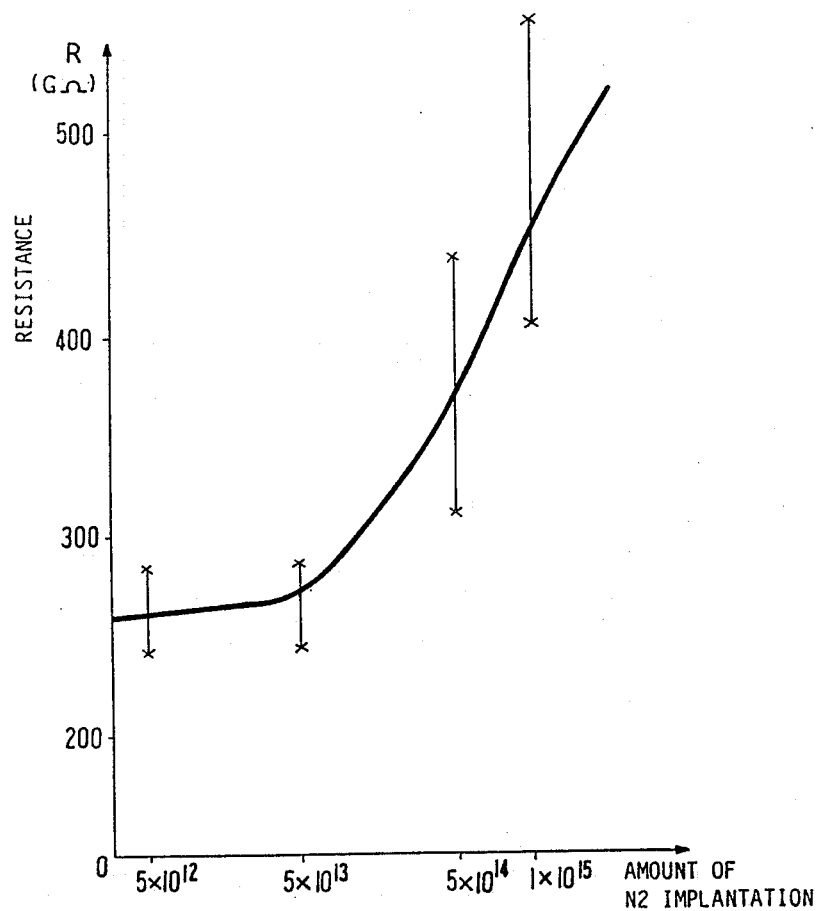
FIG. 3 shows variations of resistance values in the polycrystalline silicon as a function of the amount of nitrogen ion implantation.

After the deposition of said polycrystalline silicon layer, a first thermal oxide (17) layer is grown with a depth of 100-500 Å on the polycrystalline silicon layer in order to prevent the polycrystalline silicon from being damaged in subsequent fabrication steps. Then, ion-implantation of nitrogen (N$_2$) is carried out all over the surface of the first thermal oxide with the energy of 30-100 KeV. At this time, various resistance values of the polycrystalline silicon can be obtained depending upon the amount of implanted nitrogen, as shown in FIG. 3. Following the ion implantation of nitrogen in said step, and after a second thermal oxide layer (18) with a depth of 500-10,000 Å is grown at 800°-1200° C., the polycrystalline silicon and the nitrogen react upon each other within the polycrystalline silicon layer (15), thereby forming a layer of nitride component having (Si)$_x$·N$_y$ forms.

Figure 2C:
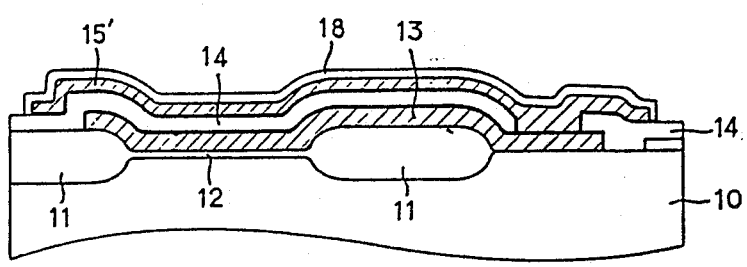
Figure 2D:
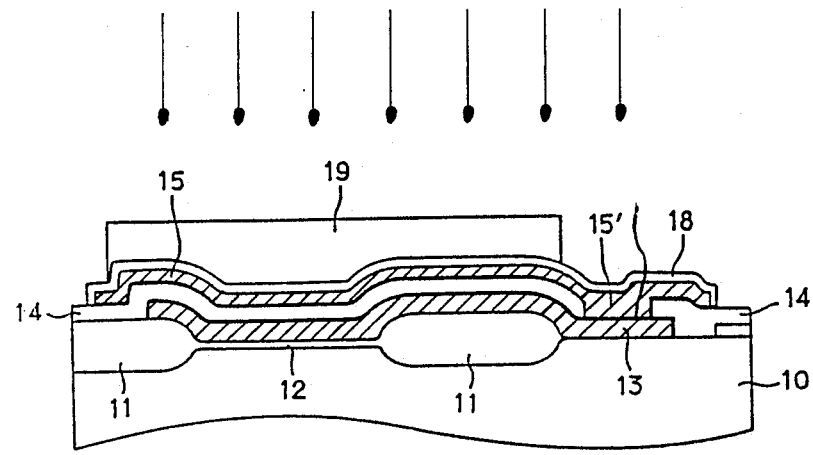
Figure 2E:
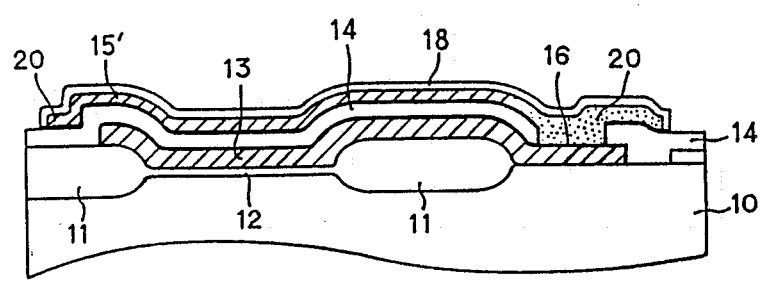

As a next step, a pattern of polycrystalline silicon (15') having high resistance is formed by using a photo mask, as shown in FIG. 2C. After the pattern of polycrystalline silicon (15') having high resistance is formed, a pattern of photo resist (19) is formed to decrease the resistance in the region (16) contacting the gate or the region for supplying the source voltage Vcc, and then ion-implantation of arsenic (As), phosphorus (P) and boron (B) is made with a dose of $1 \times 10^{15}$ to $1 \times 10^{16}$ /cm$^2$. When the photo resist (19) is removed upon completion of said ion-implantation, a polycrystalline silicon layer having high resistance area (15') and low resistance areas (20) and (20') remain as shown in FIG. 2E. Referring to FIG. 1, the polycrystalline silicon gate (13) may be regarded as the gate (3) of transistor (T2), the area (20') the node point (1), the area (15') resistor R1, and the area (20) where the source supply voltage Vcc is applied.

FIG. 3 shows variations of resistance values in the polycrystalline silicon according to the amount of nitrogen implantation, wherein the polycrystalline silicon used has a width of 1.3 $\mu$m and a length of 6 $\mu$m. As illustrated in FIG. 3, the resistance values vary significantly depending on the amount of implanted nitrogen. When the amount implanted is below $5 \times 10^{13}$ ions/cm$^2$, there does not exist noticeable difference in the resistance values compared with the case where no nitrogen is implanted. When the implanted amount, however, exceeds $5 \times 10^{13}$ ions/cm$^2$, the difference starts to increase suddenly. Therefore, the resistance increases over twice as much as the original resistance values if the implanted amount exceeds $1 \times 10^{15}$ ions/cm$^2$. In the event that the polycrystalline silicon thus formed is implanted with arsenic (As), phosphorus (P) or boron (B) with $1 \times 10^{15}$ ions/cm$^2$, the resistance value of the polycrystalline silicon implanted with nitrogen exhibits no difference in comparison with the case that no nitrogen is implanted.

As stated above, this invention will make it possible for polycrystalline silicon layers having low resistance or high resistance to be utilized in a number of ways depending on the purposes required. In particular, the invention has an advantage in that it can be greatly applied in highly-integrated SRAM devices by using the high-resistance polycrystalline silicon as a resistance material.

What is claimed is:

1. In a method for manufacturing polycrystalline silicon device having high resistance, the improvement comprising:
    a first step for depositing a polycrystalline silicon layer for a resistor area over a silicon semiconductor substrate;
    a second step for growing a first thermal oxide layer having a first specified depth over the polycrystalline silicon layer, implanting nitrogen ions over the surface of the first thermal oxide layer, and growing a second thermal oxide layer having a second specified depth on the ion-implanted first thermal oxide layer; and
    a third step of decreasing resistance of the polycrystalline silicon layer by ion implanting impurities in selected contact regions of said polycrystalline layer to be used as low resistance contacts between intermediate regions of the polycrystalline silicon layer and other regions of the device on the substrate.

2. The method according to claim 1, further comprising:
    a fourth step for forming a resistor pattern on the polycrystalline silicon with a photo etching method after growing said second thermal oxide layer.

3. In a method for manufacturing polycrystalline silicon having high resistance, the improvement comprising:
    a first step for depositing a polycrystalline silicon layer for a resistor area over a semiconductor substrate;
    a second step for implanting nitrogen ions over the surface of the polycrystalline silicon layer, and growing a thermal oxide layer having a specified depth on the ion-implanted layer; and
    a third step of ion implanting impurities to decrease resistance of the polycrystalline silicon layer in selected contact regions of the polycrystalline silicon layer to be used as low resistance contacts between intermediate regions of the polycrystalline silicon layer and other regions on the substrate.

4. In a method for manufacturing polycrystalline silicon having high resistance, the improvement comprising:
    a first step for deposition of a polycrystalline silicon layer for a resistor area over a semiconductor substrate;
    a second step of performing a first thermal process by growing a first thermal oxide layer having a first specified depth over the polycrystalline silicon layer, implanting nitrogen ions over the surface of the first thermal oxide layer and into the polycrystalline layer, and subjecting the device to a second thermal process; and
    a third step of ion implanting impurities to decrease resistance of the polycrystalline silicon in selected contact regions of the silicon polycrystalline layer to be used as low resistance contacts between intermediate regions of the polycrystalline silicon layer and other regions on the substrate.

5. In a method for manufacturing polycrystalline silicon having high resistance, the improvement comprising:
    a first step for depositing a polycrystalline silicon layer for a resistor area over a semiconductor substrate;
    a second step for growing a first thermal oxide layer having a first specified depth over the polycrystalline silicon layer, implanting ions of gases selected from the group consisting essentially of inert gases over the surface of the first thermal oxide layer, and growing a second thermal oxide layer having a second specified depth on the ion-implanted first thermal oxide layer; and
    a third step for ion implanting impurities to decrease resistance of the polycrystalline silicon layer in selected contact regions of the polycrystalline silicon layer to be used in resistance contacts between intermediate regions of the polycrystalline silicon layer and other regions on the substrate.

6. A method for manufacturing a silicon device, comprising:
    depositing an outer polycrystalline silicon layer over a first oxide layer borne by an inner polycrystalline silicon layer supported by a semiconductor substrate;
    implanting nitrogen ions into the outer polycrystalline silicon layer in a concentration of not less than $5 \cdot 10^{13}$ ions per square centimeter;
    causing the nitrogen ions and silicon in said outer polycrystalline silicon layer to react to form a nitride component layer having $(Si)_x \cdot N_y$ forms; and
    converting a selected region of the outer polycrystalline silicon layer into a low resistance contact for non-selected regions of the outer polycrystalline silicon layer by subjecting the selected region to implantation with ions other than ions of nitrogen.

7. The method of claim 6, further comprised of forming a second oxide layer over the outer silicon layer before implanting the nitrogen ions.

8. The method of claim 6, further comprised of causing the nitrogen ions and silicon in said outer silicon layer to react by growing a thermal oxide layer having a specified depth over the outer silicon layer after implanting the nitrogen ions.

9. The method of claim 7, further comprised of causing the nitrogen ions and silicon in said outer silicon layer to react by growing a second thermal oxide layer having a specified depth over the outer silicon layer after implanting the nitrogen ions.

10. The method of claim 6, further comprised of performing said step of implanting ions into said selected region of said outer polycrystalline silicon layer by implanting ions selected from a group consisting essentially of arsenic, phosphorus and boron in said selected region of said outer polycrystalline silicon layer after the nitrogen ions react with silicon in said outer polycrystalline silicon layer.

11. The method of claim 6, further comprised of depositing said selected region of said outer polycrystalline silicon layer on a particular area of said inner silicon layer to form an electrical circuit node at said particular area between said inner and outer silicon layers.

12. The method of claim 11, further comprised of performing said step of implanting ions into said selected region of said outer polycrystalline silicon layer by implanting ions selected from a group consisting essentially of arsenic, phosphorus and boron in said selected region after the nitrogen ions react with silicon in said outer polycrystalline silicon layer.

13. The method of claim 12, further comprised of forming a first thermal oxide layer over the outer silicon layer before implanting the nitrogen ions.

14. The method of claim 13, further comprised of causing the nitrogen ions and silicon in said outer silicon layer to react by growing a second thermal oxide layer having a specified depth over the outer silicon layer after implanting the nitrogen ions.

15. A method for manufacturing a polycrystalline silicon device, comprising:
 depositing an outer polycrystalline silicon layer over a first oxide layer borne by an inner polycrystalline silicon layer supported by a semiconductor substrate;
 growing a thermal second oxide layer on the outer polycrystalline silicon layer;
 implanting nitrogen ions over the surface of the thermal first oxide layer and into the outer polycrystalline silicon layer in concentrations of not less than $5 \cdot 10^{13}$ ions per square centimeter;
 growing a third oxide layer over the thermal second oxide layer to cause said nitrogen ions to react with silicon in said outer polycrystalline silicon layer to form a nitride component layer having $(Si)_x \cdot N_y$ forms;
 forming said outer polycrystalline silicon layer into a pattern for a high resistance component; and then converting selected regions of the outer polycrystalline silicon layer into low resistance contacts for non-selected regions of the outer polycrystalline silicon layer by implanting the selected region with second and different ions.

16. The method of claim 15, further comprised of performing said step of implanting ions into said selected regions of said outer polycrystalline silicon layer by implanting ions selected from a group consisting essentially of arsenic, phosphorus and boron in said selected regions after the nitrogen ions react with silicon in said outer polycrystalline silicon layer.

17. The method of claim 15, further comprised of depositing said outer polycrystalline silicon layer on particular areas of said inner polycrystalline silicon layer to form electrical circuit nodes between said inner and outer polycrystalline silicon layers at adjoining ones of said selected regions and particular areas.

18. The method of claim 17, further comprised of performing said step of implanting ions into said selected regions of said outer polycrystalline silicon layer by implanting ions selected from a group consisting essentially of arsenic, phosphorus and boron in said selected regions after the nitrogen ions react with silicon in said outer polycrystalline silicon layer.

19. A process for making random access memory, comprising:
 forming a first and a second transistor on a semiconductor substrate, and each providing corresponding first and second nodes and having conduction electrodes coupled between corresponding ones of said first and second nodes and a terminal for a reference potential, with control electrodes of said first and second transistors coupled to respective ones of said second and first nodes;
 forming a third and a fourth transistor on said substrate, with each of said third and fourth transistors having a control electrode and conduction electrodes coupled to respective ones of said first and second nodes;
 forming a plurality of layers of polycrystalline silicon disposed upon said substrate and ion implanted with nitrogen ions implanted in an amount not less than $5 \cdot 10^{13}$ ions per square centimeter, said layers of polycrystalline silicon each having first regions respectively coupled to said first and second nodes and ion implanted with ions to decrease resistivity of said first regions, and second regions providing terminals for a voltage terminal and ion implanted with ions to decrease resistivity of said second regions;
 forming a first bit line and a complementary bit line connected to respective ones of said first and second nodes via corresponding ones of said conduction electrodes of said third and fourth transistors; and
 forming a word line coupled to said control electrodes of said word lines.

20. The process of claim 19, further comprised of disposing said plurality of layers of polycrystalline silicon above, and separated by a silicon oxide layer from, different ones of said control electrodes of said first and second transistors.

21. The process of claim 19, further comprised of:
 forming said control electrodes of said first and second transistors with a plurality of lower layers of silicon;
 disposing a silicon oxide layer above said plurality of lower layers except at said first and second nodes; and
 disposing said plurality of layers of polycrystalline silicon above, and separated by said silicon oxide layer from, different ones of said control electrodes of said first and second transistors.

* * * * *